United States Patent
Gao et al.

(10) Patent No.: US 7,612,625 B2
(45) Date of Patent: Nov. 3, 2009

(54) BANG-BANG ARCHITECTURE

(75) Inventors: Miaobin Gao, Saratoga, CA (US);
Yu-Li Hsueh, Mountain View, CA (US);
Chien-Chang Liu, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 51 days.

(21) Appl. No.: 12/070,440

(22) Filed: Feb. 19, 2008

(65) Prior Publication Data

US 2009/0208226 A1 Aug. 20, 2009

(51) Int. Cl.
*H03B 5/12* (2006.01)
*H03B 27/00* (2006.01)
*H03L 7/099* (2006.01)

(52) U.S. Cl. .................. 331/177 R; 331/34; 331/36 C; 331/45; 331/48; 331/117 FE; 331/25; 331/177 V; 331/179; 375/376

(58) Field of Classification Search .................. 331/18, 331/25, 34, 45, 46, 48, 117 R, 117 FE, 117 D, 331/167, 168, 177 R, 177 V, 179, 36 C; 375/376
See application file for complete search history.

(56) References Cited

U.S. PATENT DOCUMENTS

| | | | |
|---|---|---|---|
| 5,187,450 A | * | 2/1993 | Wagner et al. .................. 331/96 |
| 5,872,488 A | | 2/1999 | Lai |
| 5,973,573 A | | 10/1999 | Iravani et al. |
| 2005/0062548 A1 | | 3/2005 | Lim et al. |
| 2006/0067710 A1 | | 3/2006 | Liu et al. .................... 398/202 |
| 2007/0229173 A1 | | 10/2007 | Kelkar et al. |

FOREIGN PATENT DOCUMENTS

KR 10-2004-0077304 9/2004

OTHER PUBLICATIONS

R. Walker, "Designing Bang-Bang PLLs for Clock and Data Recovery in Serial Data Transmission Systems," Phase-Locking in High-Performance Systems From Devices to Architectures. Edited by Behzad Razavi, pp. 34-45. John Wiley & Sons, Inc., 2003.
J. E. Rogers, and J. R. Long, "A 10-Gb/s CDR/DEMUX With LC Delay Line VCO in 0.18-um CMOS," IEEE J. Solid-State Circuits, vol. 37, No. 12, pp. 1781-1789, Dec. 2002.
H. Werker, S. Mechnig, C. Holuigue, etc., "A 10Gb/s SONET-Compliant CMOS Transceiver with Low Cross-Talk and Intrinsic Jitter," ISSCC Dig. Tech. Papers, pp. 172-520, Feb. 2004.
S. Li, I. Kipnis, and M. Ismail, "A 10-GHz CMOS Quadrature LC-VCO for Multirate Optical Applications," IEEE J. Solid-State Circuits, vol. 38, No. 10, pp. 1626-1634, Oct. 2003.
PCT/US2009/032959 International Search Report with Written Opinion of the International Search Authority Mailed Jun. 30, 2009 in a related application.

* cited by examiner

*Primary Examiner*—David Mis
(74) *Attorney, Agent, or Firm*—Trop, Pruner & Hu, P.C.

(57) ABSTRACT

In one embodiment, the present invention includes an apparatus having a voltage controlled oscillator (VCO) to generate a first clock signal having a frequency controlled by a bias current coupling ratio of first and second bias currents, and a control circuit coupled to the VCO to generate a first pair of control signals to adjust the bias current coupling ratio. Other embodiments are described and claimed.

22 Claims, 5 Drawing Sheets

BANG-BANG ARCHITECTURE

BACKGROUND

Clock and data recovery (CDR) is widely used in digital communication. Most monolithic CDR implementations use a phase locked loop (PLL), which typically includes a phase detector (PD), a charge pump (CP), some type of loop filter and a voltage controlled oscillator (VCO). Many CDRs also need a frequency acquisition mechanism to assist the phase locking, which requires an external reference clock source, like a crystal oscillator.

Bang-bang CDR architectures use a bang-bang VCO, which has a bang-bang digital input directly connected to a phase and/or frequency detector. The digital bang-bang input can change the VCO frequency instantaneously by a small amount, which is called a bang-bang frequency, fbb. This type of architecture can stabilize the PLL, make the loop filter much easier to design, and allowing the CDR jitter transfer and jitter tolerance corner frequency to be much easier to control. Typical bang-bang VCOs, however, are ring-based oscillators. As data rates move higher and higher, especially greater than 10 gigabytes per second (Gb/s), an inductor-capacitor (LC) tank-based VCO has advantages over a ring-based VCO, such as lower phase noise, making it easier to operate at high frequencies.

DETAILED DESCRIPTION

In various embodiments, a bang-bang controller may be provided to control a LC-tank-based quadrature VCO. In this way, agile frequency adjustments to the VCO may be provided without the need for extensive associated circuitry. Still further, reduced loop filter complexity may be realized, as well as reduced loop circuit dependency of process, voltage and temperature (PVT) variation.

Figure 1:
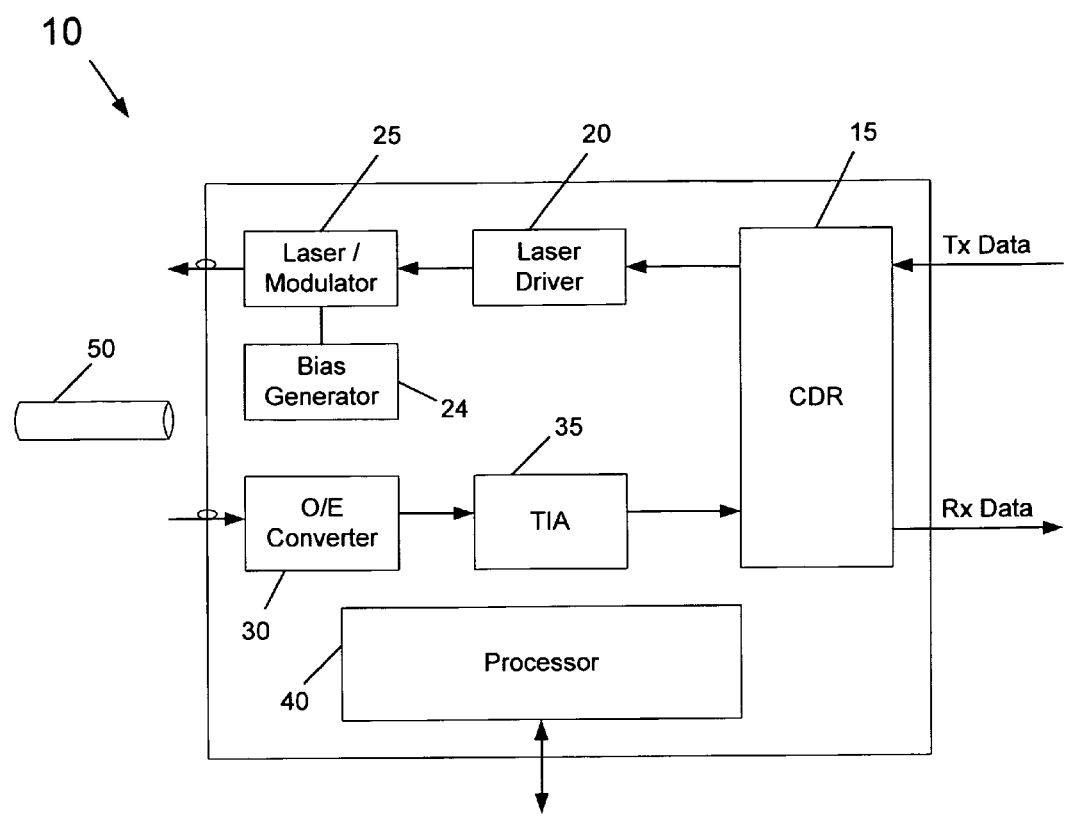
FIG. 1 is a block diagram of an optical transceiver in accordance with an embodiment of the present invention.

Referring now to FIG. 1, shown is a block diagram of an optical transceiver in accordance with an embodiment of the present invention. Transceiver 10 may act as an interface between a physical layer and a data link layer of a data communications system. As shown in FIG. 1, transceiver 10 may be used to receive and transmit optical information from/to an optical fiber 50. In turn, received data may be converted to electrical energy and provided to other portions of a system via a system interface as received data (RX Data). Similarly, incoming electrical energy corresponding to data to be transmitted (TX Data) may be received from the system and converted to optical energy for transmission via optical fiber 50.

Thus as shown in FIG. 1, transceiver 10 includes in a transmit direction a clock and data recovery (CDR) circuit 15 that receives data and provides the data to a laser driver 20 which in turn drives a laser/modulator 25 to convert the electrical data to optical data for transmission via optical fiber 50. Thus as there is no reference clock provided to CDR 15, it acts as a referenceless CDR, and may be of a bang-bang architecture, as described further below. A bias generator 24 may be coupled to laser/modulator 25 to provide a bias current thereto. Transceiver 10 includes in a receive direction an optical/electrical (O/E) converter 30 which may, in one embodiment be a positive intrinsic negative (PIN) diode or an avalanche photodetector (APD). The converted electrical energy may be provided to a transimpedance amplifier (TIA) 35 which converts the current into an electrical voltage. This amplified signal may be provided to CDR 15 to convert analog input data to a digital bitstream with an associated clock. In turn the data may be provided to other portions of a system as RX Data.

Note further the transceiver 10 of FIG. 1 may also include a processor 40 to handle control operations as well as to provide an interface for management and/or diagnostic information. In one embodiment, transceiver 10 may be formed as an integrated circuit (IC) on a single substrate, although the scope of the present invention is not limited in this regard. While shown with this particular implementation in the embodiment of FIG. 1, the scope of the present invention is not limited in this regard.

Figure 2:
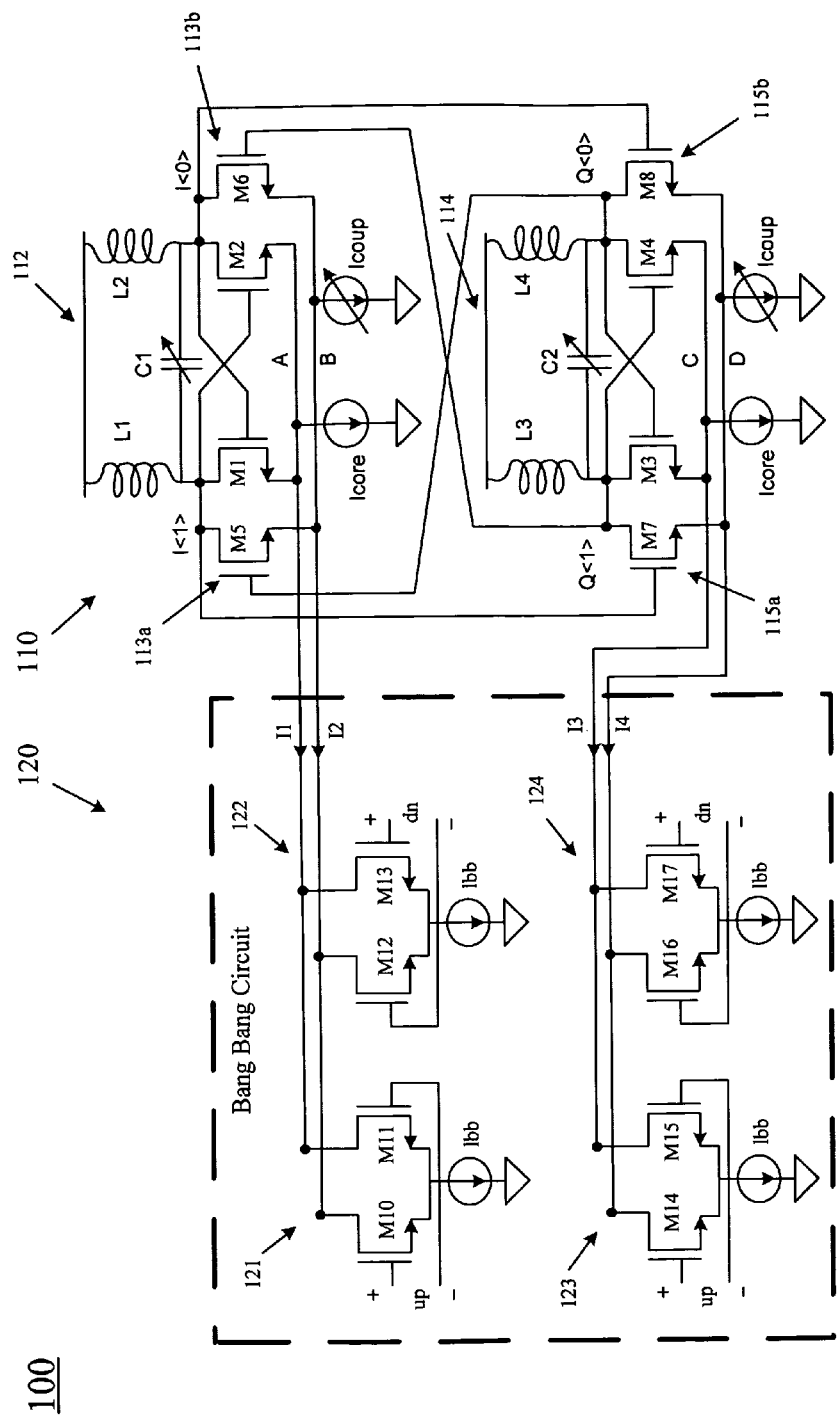
FIG. 2 is a block diagram of a voltage controlled oscillator (VCO) and control circuit in accordance with one embodiment of the present invention.

A quadrature VCO generates two clock outputs, I and Q, which have a phase difference of 90°. FIG. 2 is a block diagram of a VCO and control circuit in accordance with one embodiment of the present invention. As shown in FIG. 2, a circuit 100, which may be part of a CDR, includes a VCO 110, which may be a quadrature LC VCO that is controlled, in part, using a bang-bang circuit 120. In this way, circuit 100 may provide a so-called bang-bang quadrature LC VCO.

As shown in FIG. 2, VCO 100 includes a first tank 112 and a second tank 114, i.e., an in-phase (or I) tank 112 and a quadrature (or Q) tank 114. As shown in FIG. 2, each tank includes a pair of inductors and a controllable capacitance. Specifically, tank 112 includes a pair of inductors L1 and L2 and a controllable capacitance C1, while tank 114 includes inductors L3 and L4 and a controllable capacitance C2. These tanks each have differential pairs of metal oxide semiconductor field effect transistors (MOSFETs) coupled between the tank LC components and a pair of current sources, $I_{core}$ and $I_{coup}$. As shown in FIG. 2, tank 112 includes a first differential pair 113a, which may include n-channel MOSFETs (nMOSFETs) M1 and M5 having drain terminals coupled to a node I<1>, and source terminals coupled to nodes A (for MOSFET M1) and B (for MOSFET M5), respectively. Similarly, a second differential pair $113_b$ includes nMOSFETs M2 and M6 having drain terminals coupled to a node I<0> and source terminals coupled to nodes A (for MOSFET M2) and B (for MOSFET M6), respectively.

In turn, nodes A and B are coupled, respectively, to a current source $I_{core}$ and a current source $I_{coup}$, which is an adjustable current source. As will be described further below, these nodes are further coupled to receive control currents I1 and I2, respectively, from bang-bang circuit 120.

Differential pairs $115_a$ and $115_b$ are similarly adapted between nodes Q<1> and Q<0> and nodes C and D. The configuration of tanks 112 and 114 is anti-phase coupling, which forces the I and Q outputs to have a quadrature phase relationship (i.e., 90°). This anti-phase coupling is realized by providing the bias currents present at nodes A and B, each to one of the MOSFETs of first and second differential pairs 113a and 113b. These bias currents are formed from the currents provided by current sources $I_{core}$ and $I_{coup}$, as well as the control currents I1 and I2 provided from bang-bang circuit 120. Similar control of tank 114 is provided by the bias currents present at nodes C and D, realized by the currents provided by current sources $I_{core}$ and $I_{coup}$ and control currents I3 and I4. The clock frequency can be tuned by varying the bias current coupling ratio, Icoup/Icore, by way of controlling current source Icoup.

In order to incorporate the bang-bang function into a quadrature VCO, bang-bang 120 circuit can be coupled to VCO 110 to control its frequency. As shown in FIG. 2, one embodiment of bang-bang circuit 120 may include differential pairs of MOSFETs, each having output terminals coupled to provide output currents, namely control signals I1-I4 to VCO 110. Specifically, bang-bang circuit 120 includes a first differential pair 121 including MOSFETs M10 and M11, which have source terminals coupled to a current source, $I_{bb}$ (referred to herein as a bang-bang current), and which are gated by a differential control signal, "up," to thus provide outputs from their drain terminals. Second differential pair 122 similarly includes MOSFETs M12 and M13 having source terminals coupled to current source $I_{bb}$ and having gates coupled to receive a second differential control signal, "dn," and having drain terminals coupled in common with the drain terminals of first differential pair 121. Thus differential pairs 121 and 122 in combination generate output currents I1 and I2. Similarly, a third differential pair 123 includes MOSFETs M14 and M15 gated by the differential control signal "up" to provide outputs from their drain terminals. A fourth differential pair 124 includes MOSFETs M16 and M17 having source terminals coupled to current source $I_{bb}$ and having gates coupled to receive the differential control signal "dn" and having drain terminals coupled in common with the drain terminals of third differential pair 123 to thus provide control signals I3 and I4 to nodes C and D of tank 114. Note that while shown in FIG. 2 with a differential implementation, the scope of the present invention is not limited in this regard, and other embodiments may be used in a single-ended VCO. Still further, embodiments may provide bang-bang control for a single phase tank-based VCO. Note that in various implementations, ratios between $I_{bb}$, $I_{core}$ and $I_{coup}$ may be fixed such that the frequency adjustments enabled by changing the control currents I1-I4 do not depend on variations such as process, voltage and temperature.

In various embodiments, the control signals "up" and "dn" may be received from a phase detector or phase frequency detector of a CDR, although the scope of the present invention is not limited in this regard. These control signals may be received at high speeds to directly drive differential pairs 121-124 to generate currents I1-I4.

As shown in FIG. 2, control circuits I1 and I2 are merged into nodes "A" and "B" respectively, which sets the coupling ratio to be $(I_{coup}+I2)/(I_{core}+I1)$, and thus generates the VCO frequency accordingly. On the quadrature side, control currents I3 and I4 are merged into nodes "C" and "D", which cause a similar change to the corresponding ratio and VCO frequency. Note that when the VCO frequency is substantially equal to the frequency of the incoming data, the "up" signal and the "dn" signal are equal (either active or inactive), and thus control currents I1 and I2 are of equal value, and control currents I3 and I4 are of equal value.

Figure 3:
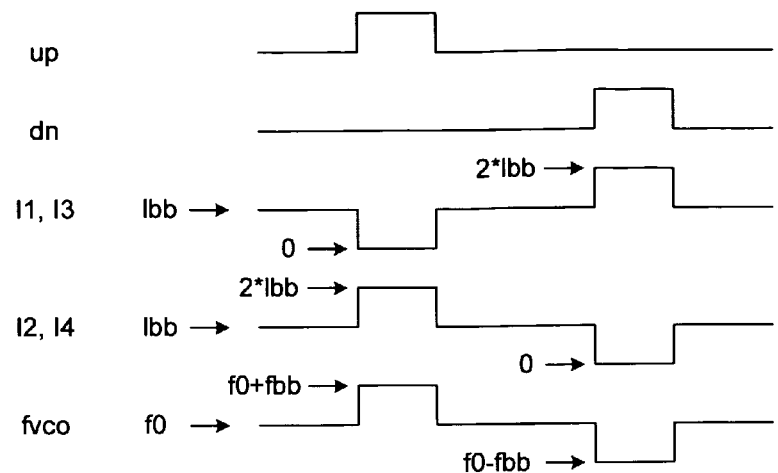
FIG. 3 shows a timing diagram of operation of a VCO in accordance with one embodiment of the present invention.

FIG. 3 shows a timing diagram of operation of a VCO in accordance with one embodiment of the present invention. When the VCO frequency is too slow compared to the data rate, the "up" signal is activated to logic high, which makes I2=2*Ibb, and I1=0 (with the same values for I4 and I3, respectively). This increases the coupling ratio to be (Icoup+2*Ibb)/Icore, and this instant ratio change changes the VCO frequency from f0 to f0+fbb. The bang-bang frequency fbb thus makes the VCO faster to correspond to the data rate, and to attempt to align the clock transition edge to the data transition edge. Similarly, when the VCO frequency is too fast compared to the data rate, the "dn" signal is activated to logic high, which makes I2=0, and I1=2*Ibb (with the same values for I4 and I3, respectively). This reduces the coupling ratio to be Icoup/(Icore+2*Ibb), and this instant ratio change changes the VCO frequency from f0 to f0-fbb, causing the VCO frequency to slow down. Similar changes occur to the frequency of tank 114 under control of adjustable currents I3 and I4.

Figure 4:
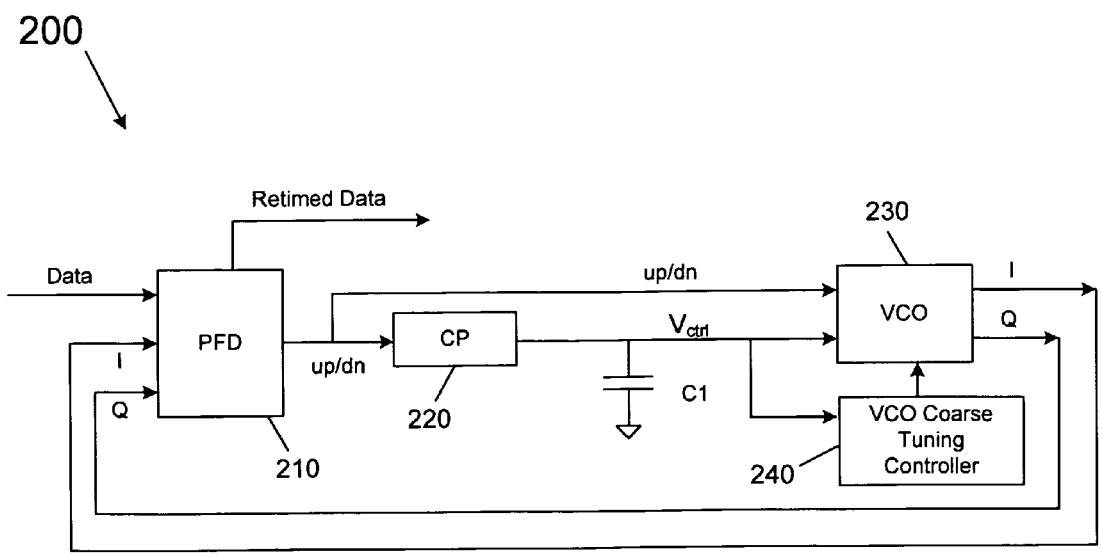
FIG. 4 shows a bang-bang CDR architecture in accordance with one embodiment of the present invention.

FIG. 4 shows a bang-bang CDR architecture in accordance with one embodiment of the present invention. As shown in FIG. 4, CDR 200 is coupled to receive incoming data, e.g., from a transmitter to which a receiver including the CDR is coupled. More specifically, CDR 200 receives incoming data at a phase/frequency detector (PFD) 210 which is further coupled to receive the quadrature VCO output signals, I and Q. PFD 210 operates to recover the data according to the VCO clock signals to thus generate retimed data, which may be provided to other circuitry of the receiver. Furthermore, PFD 210 is coupled to a charge pump 220. In addition, PFD 210 generates control signals, namely the "up/dn" control signals that are provided directly to VCO 230. Charge pump 220 generates a control current that, through a loop filter, provides a control voltage, $V_{ctrl}$, to VCO 230 and to a VCO coarse tuning controller 240. Note that loop filter of CDR 200 may be a single capacitor, C1, which may be a single off-chip capacitor in some embodiments. In such embodiments, C1 may be between approximately 5-15 nanoFarads (nF) and in one embodiment may be 10 nF, where the control current may be on the order of approximately 50 microamperes (μA). Responsive to the control voltage, a coarse tuning control signal from coarse tuning controller 240, and the "up/dn" control signals, VCO 230 thus generates quadrature VCO clock signals, which are provided to PFD 210.

In the embodiment of FIG. 4, a reference clock is not needed since the quadrature I and Q clocks are used by PFD 210. CP 220 drives the VCO control line (Vctrl) which controls the VCO center frequency f0. In various embodiments, this control voltage may control the current generated by current source $I_{coup}$ (shown in FIG. 2). This control path is referred to as a slow tuning path, as changes to the frequency of the I and Q clock signals occur very slowly (e.g., 15 Hertz (Hz) within 100 picoseconds (ps)). Meanwhile, the PFD "up/dn" signals directly drive the bang-bang input of VCO 230. This control path is referred to as a fast tuning path. In various embodiments, this fast tuning path causes changes to the center frequency, and may enable changes of, e.g., 5 MHz within 100 ps. The VCO coarse tuning controller 240 assists the loop frequency locking process to make the VCO frequency to settle at the right tuning band, as controller 240 receives the control voltage and causes an adjustment to controllable capacitances C1 and C2 (of tanks 112 and 114 of FIG. 2).

Since the bang-bang quadrature LC VCO is used in this bang-bang loop architecture, the CDR loop filter can be simplified to be only a single external capacitor C1. This greatly reduces the chip bonding wire ringing effect on the voltage control line, and makes the loop filter design and the loop control much easier. The jitter generation, jitter transfer bandwidth and the jitter tolerance are all controlled by one parameter, fbb, which can greatly reduce the loop circuitry dependency over process, temperature and supply variation. Since the CDR loop lock range is controlled by the slow tuning path, this decouples the lock range from jitter tolerance and jitter generation, providing more design freedom.

Figure 5:
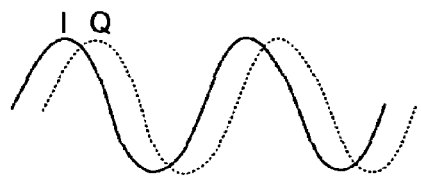
FIG. 5 is a timing diagram of quadrature VCO clock outputs in accordance with one embodiment of the present invention.
Figure 6:
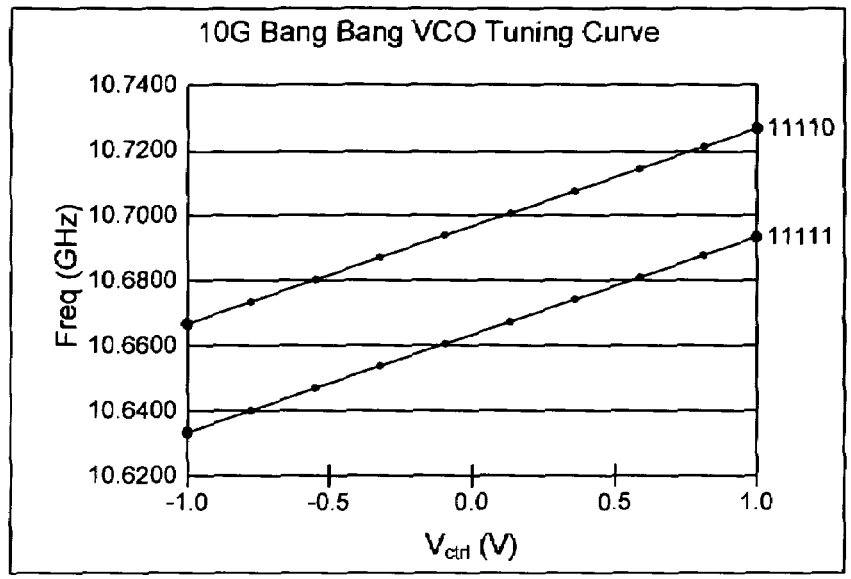
FIG. 6 is a graphical illustration of control voltage versus frequency of a bang-bang-controlled VCO in accordance with an embodiment of the present invention.
Figure 7:
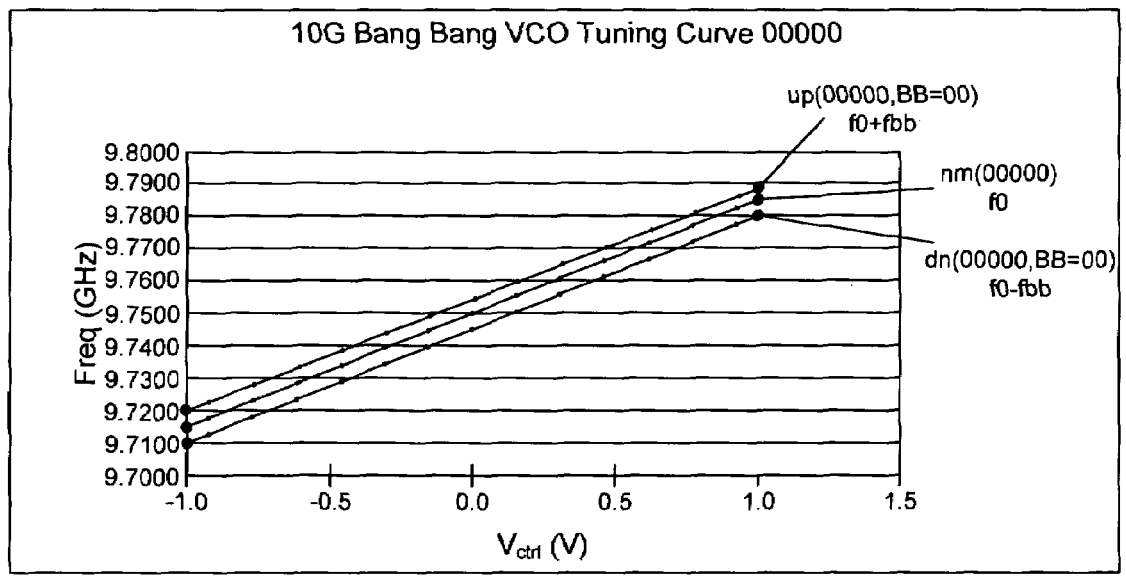
FIG. 7 is a graphical illustration of a tuning curve at bang-bang frequency-controlled values in accordance with an embodiment of the present invention.

FIG. 5 is a timing diagram of quadrature VCO clock outputs in accordance with an embodiment of the present invention. As shown in FIG. 5, VCO outputs may be sine waves separated by 90 degrees such that the quadrature phase output lags the in-phase output by 90 degrees. Referring now to FIG. 6, shown is a graphical illustration of control voltage versus frequency of a bang-bang-controlled VCO in accordance with an embodiment of the present invention. FIG. 6 shows VCO tuning curves at two different digital band codes (11110 and 11111). As shown in FIG. 6, a substantially linear tuning curve at a frequency greater than 10 GHz is realized. Referring now to FIG. 7, shown is a graphical illustration of a tuning curve at bang-bang frequency-controlled values. Specifically, FIG. 7 shows a similar tuning curve at a center frequency of fo, as well as at frequencies varying from this center frequency by plus or minus the bang-bang frequency, $f_{bb}$. This monotonic bang-bang frequency curve thus enables high speed function of the bang-bang CDR loop. Although the embodiment described above is described in the context of a referenceless bang-bang CDR architecture, embodiments can be used by any type of CDR/PLL based on a bang-bang loop mechanism.

As data rates move higher and higher, a LC VCO has better performance than a ring-based VCO. Embodiments thus enable a bang-bang loop CDR architecture at a high data rate (e.g., 10 Gb/s) or greater. Still further, using a bang-bang quadrature LC VCO in a bang-bang loop CDR architecture, I and Q clocks can be used to control a PFD, and an external reference clock can be avoided, which makes the system level design easier and less costly. Embodiments use current steering, which can be much faster than driving varactors to control a VCO, especially at higher data rates. Also, by making the Ibb, and Icore, Icoup at a fixed ratio, bang-bang frequency fbb does not depends on temperature, process and supply variations.

Embodiments thus enable high data rate CDR design to be easier and more flexible, removing the external reference clock (such as a crystal), saving cost for a fiber optic transceiver, active cable, and fiber link, and making system level design easier.

Figure 8:
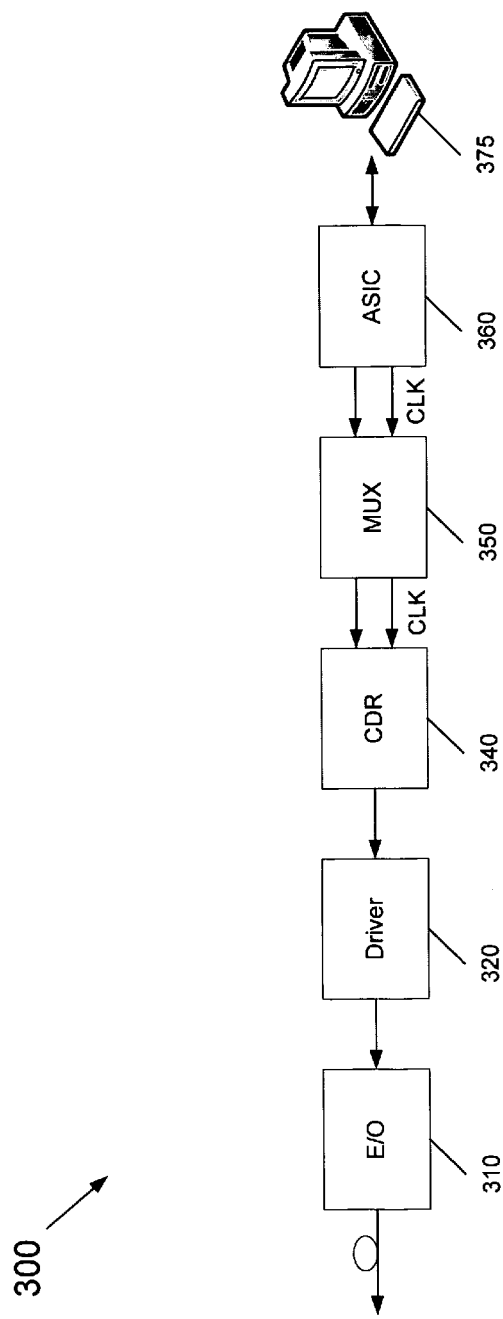
FIG. 8 is a block diagram of a system in accordance with one embodiment of the present invention.

Referring now to FIG. 8, shown is a block diagram of a system in accordance with one embodiment of the present invention. As shown in FIG. 8, system 300 may include a line card or other switching device used in, for example, a high speed optical network, such as a metro area network (MAN), a local area network (LAN) or a wide area network (WAN). As shown in FIG. 8, system 300 may be used to transmit optical signal information along, e.g., an optical fiber. Data to be transmitted may be generated in a computer system 375. Digital data may be provided to an application specific integrated circuit (ASIC) 360, such as a media access control (MAC) module. ASIC 360 may code the data accordingly and provide it along with a clock signal to a multiplexer 350, which may convert parallel data received at a first frequency to a serial high-speed data stream, e.g., at a much higher frequency. In one embodiment, multiplexer 350 may take four or more parallel data streams and transform the data into a serial data signal. The serial data stream may then be provided to a CDR 340, which may be a referenceless CDR in accordance with an embodiment of the present invention, to convert the digital bit stream at an associated clock rate into an analog input signal that includes the embedded clock signal. From CDR 340, the analog signal may be provided to a driver 320. Accordingly, a drive signal which may include modulated signal information as well as a bias current source may be provided to an electrical-to-optical (E/O) converter 310, which may correspond to a laser or other optical source. O/E converter 310 may convert the incoming electrical energy to optical energy for transmission along an optical fiber.

Note that various components shown in FIG. 8 may form a line-card that serves as an interface between an optical fiber line and system 375. Such a line card may also include components to receive and process optical signals received from the optical fiber, such as a photodetector, amplifiers, demultiplexers and so forth. White shown with this particular implementation in the embodiment of FIG. 8, understand the scope of the present invention is not limited in this regard.

Embodiments may be implemented in code and may be stored on a storage medium having stored thereon instructions which can be used to program a system to perform the instructions. The storage medium may include, but is not limited to, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a voltage controlled oscillator (VCO) including a first tank, wherein the first tank is to generate a first clock signal having a first frequency controlled by a bias current coupling ratio of a first bias current and a second bias current provided to the first tank; and
   a control circuit coupled to the VCO to generate a first pair of control signals to adjust the bias current coupling ratio.

2. The apparatus of claim 1, wherein the control circuit is to generate the first pair of control signals having first and second values responsive to a first signal received from a phase frequency detector (PFD) coupled to receive the first clock signal, the PFD to generate the first signal when the first clock signal is less than a data rate of incoming data to the PFD.

3. The apparatus of claim 2, wherein the control circuit is to generate the first pair of control signals having third and fourth values responsive to a second signal received from the PFD when the first clock signal is greater than the data rate, wherein the third value equals the second value and the fourth value equals the first value.

4. The apparatus of claim 2, further comprising a charge pump coupled to an output of the PFD and to cause a control voltage to be provided to the VCO to generate a center frequency of the first clock signal responsive thereto.

5. The apparatus of claim 4, wherein the apparatus comprises a clock and data recovery (CDR) circuit including the PFD and the charge pump, the CDR circuit having a loop filter formed of a single external capacitor to generate the control voltage from a signal output by the PFD.

6. The apparatus of claim 5, wherein the CDR circuit comprises a referenceless CDR circuit.

7. The apparatus of claim 4, wherein the control circuit includes:
a first differential pair of metal oxide semiconductor field effect transistors (MOSFETs) including a first MOSFET gated by the first signal to provide a first bang-bang current to a first output node, and a second MOSFET gated by the first signal to provide a second bang-bang current to a second output node; and
a second differential pair of MOSFETs including a third MOSFET gated by the second signal to provide a third bang-bang current to the second output node, and a fourth MOSFET gated by the second signal to provide a fourth bang-bang current to the first output node.

8. The apparatus of claim 7, wherein the first output node is coupled to the VCO to merge the first and fourth bang-bang currents with an output of a first current source.

9. The apparatus of claim 8, wherein the second output node is coupled to the VCO to merge the second and third bang-bang currents with an output of a second current source, and wherein the first current source is controlled responsive to the control voltage.

10. A method comprising:
receiving a first signal in a control circuit responsive to an indication that a frequency of a voltage controlled oscillator (VCO) is different than a frequency of incoming data to a receiver including the VCO;
generating a first control signal having a current value responsive to the first signal; and
providing the first control signal to a first bias node of the VCO to adjust the VCO frequency in accordance with a change in a bias current coupling ratio between a first bias current and a second bias current, the first bias current including the first control signal.

11. The method of claim 10, further comprising providing first and second control signals, each having equal values, to first and second bias nodes of the VCO, respectively, if the VCO frequency is substantially equal to the incoming data frequency.

12. The method of claim 10, further comprising:
generating the first control signal having the current value equal to twice a bang-bang value; and
providing the first control signal to the first bias node to increase the VCO frequency in accordance with the change in the bias current coupling ratio.

13. The method of claim 12, further comprising receiving the first signal from a phase frequency detector (PFD) coupled to receive the VCO frequency and the incoming data.

14. The method of claim 12, further comprising generating a control voltage to generate a center frequency of the VCO responsive to the first and second control signals, using a single external capacitor coupled to the receiver.

15. The method of claim 12, wherein the first control signal has no current value if the VCO frequency is higher than the incoming data frequency.

16. The method of claim 11, wherein the VCO comprises a quadrature tank-based VCO.

17. A system comprising:
a clock and data recovery (CDR) circuit including:
a detector to receive incoming data and a clock signal from a tank oscillator, the detector to generate first and second signals indicative of a frequency relationship between the incoming data and the clock signal;
a controller coupled to receive the first and second signals from the detector and to generate a first adjustable current and a second adjustable current responsive thereto; and
the tank oscillator to receive the first and second adjustable currents and to generate the clock signal having a frequency according to a ratio between a first bias current including the first adjustable current and a second bias current including the second adjustable current; and
an optical-to-electrical converter coupled to the CDR circuit to provide the incoming data to the CDR circuit.

18. The system of claim 17, further comprising a charge pump coupled to an output of the detector and to generate a charge signal to cause a control voltage to be provided to the tank oscillator to generate a center frequency of the clock signal.

19. The system of claim 18, further comprising a loop filter coupled between the charge pump and the tank oscillator having a single external capacitor to generate the control voltage.

20. The system of claim 17, wherein the controller includes:
a first differential pair of metal oxide semiconductor field effect transistors (MOSFETs) including a first MOSFET gated when the first signal is active to provide a first current to a first output node, and a second MOSFET gated when the first signal is inactive to provide the first current to a second output node; and
a second differential pair of MOSFETs including a third MOSFET gated when the second signal is active to provide a second current to the second output node, and a fourth MOSFET gated when the second signal is inactive to provide the second current to the first output node.

21. The system of claim 17, wherein the controller is to generate the first adjustable current having a first current value when a data rate of the incoming data is substantially equal to the clock signal and to generate the first adjustable current having a second current value that is substantially double the first current value when the data rate is less than the clock signal.

22. The system of claim 21, wherein the controller is to generate the first adjustable current having substantially no current value when the data rate is higher than the clock signal.

* * * * *